United States Patent
Nakamura et al.

(10) Patent No.: US 8,006,357 B2
(45) Date of Patent: Aug. 30, 2011

(54) PROCESS FOR FABRICATING PIEZOELECTRIC ELEMENT

(75) Inventors: Yuki Nakamura, Hyogo (JP); Yuji Murashima, Osaka (JP); Masahiro Yasumi, Osaka (JP); Kazuki Komaki, Osaka (JP)

(73) Assignee: Panasonic Corporation, Osaka (JP)

( * ) Notice: Subject to any disclaimer, the term of this patent is extended or adjusted under 35 U.S.C. 154(b) by 932 days.

(21) Appl. No.: 11/813,551

(22) PCT Filed: Feb. 15, 2006

(86) PCT No.: PCT/JP2006/302619
§ 371 (c)(1),
(2), (4) Date: Jul. 9, 2007

(87) PCT Pub. No.: WO2006/090618
PCT Pub. Date: Aug. 31, 2006

(65) Prior Publication Data
US 2010/0125988 A1    May 27, 2010

(30) Foreign Application Priority Data

Feb. 23, 2005 (JP) ................. 2005-046749

(51) Int. Cl.
*H01L 41/22* (2006.01)
*H04R 17/00* (2006.01)
*B21D 53/76* (2006.01)
*B23P 17/00* (2006.01)

(52) U.S. Cl. ..................... 29/25.35; 29/890.1

(58) Field of Classification Search .............. 29/25.35, 29/890.1, 593, 417; 427/100; 216/58
See application file for complete search history.

(56) References Cited

U.S. PATENT DOCUMENTS

| 3,909,924 | A  | * | 10/1975 | Vindasius et al. | ............ | 438/17 |
| 6,308,554 | B1 | * | 10/2001 | Mattes et al. | ................ | 73/1.37 |
| 6,367,133 | B2 | * | 4/2002  | Ikada et al. | ................ | 29/25.35 |
| 7,497,962 | B2 | * | 3/2009  | Tokunaga | ..................... | 216/27 |

(Continued)

FOREIGN PATENT DOCUMENTS

| JP | 54-032268  | 3/1979 |
| JP | 09-214271  | 8/1997 |
| JP | 10-104387  | 4/1998 |

(Continued)

OTHER PUBLICATIONS

International Search Report for application No. PCT/JP2006/302619 dated Apr. 18, 2006.

*Primary Examiner* — A Dexter Tugbang
*Assistant Examiner* — David Angwin
(74) *Attorney, Agent, or Firm* — RatnerPrestia

(57) ABSTRACT

In a production method of a piezoelectric element, an unneeded electric field is prevented from being applied to a piezoelectric thin film layer during the production process, resulting in a high performance piezoelectric element production method. The production method includes a first process for depositing an under electrode layer, a piezoelectric thin film layer and an upper electrode layer successively on a substrate such that the under electrode layer and the upper electrode layer form a short-circuit, a second process, after the first process, for etching including dry etching, the second process commenced while the under electrode layer and the upper electrode layer are short-circuited, a third process, after the second process, for polarizing by applying a voltage across the under electrode layer and the upper electrode layer, a fourth process, after the third process, for individualizing each piezoelectric element.

9 Claims, 8 Drawing Sheets

U.S. PATENT DOCUMENTS

| | | | |
|---|---|---|---|
| 7,665,196 B2* | 2/2010 | Lee et al. | 29/25.35 |
| 2004/0026362 A1* | 2/2004 | Nakatani | 216/13 |
| 2005/0190241 A1* | 9/2005 | Lee et al. | 347/70 |
| 2010/0125988 A1* | 5/2010 | Nakamura et al. | 29/25.35 |

FOREIGN PATENT DOCUMENTS

| | | |
|---|---|---|
| JP | 2000-091656 | 3/2000 |
| JP | 2003-298137 | 10/2003 |
| JP | 2003-347303 | 12/2003 |

* cited by examiner

PROCESS FOR FABRICATING PIEZOELECTRIC ELEMENT

TECHNICAL FIELD

This invention relates to a production method of a piezoelectric element using a piezoelectric thin film to be used for a sensor, an actuator or the like.

BACKGROUND OF ART

A piezoelectric thin film made of ferroelectrics in a perovskite-type structure has a superb dielectric, piezoelectric and pyroelectric effect, and is expected to be widely used for a variety of piezoelectric devices including sensors, actuators and transducers. The piezoelectric thin film of ferroelectrics has inherently a spontaneous polarization. When stress is applied to the piezoelectric thin film, the polarization state is changed by strain and which is detected as a current. When a voltage is applied to the thin film, the film expands and contracts in response to an intensity of the applied voltage.

A piezoelectric element using the piezoelectric thin film is produced by depositing an under electrode layer, a piezoelectric thin film layer and an upper electrode layer successively on a substrate. When a voltage is applied across the under electrode layer and the upper electrode layer, the piezoelectric thin film layer expands and contracts, causing a mechanical displacement. Due to this characteristic, for improving performance of the piezoelectric element, it is important to align a polarizing direction of the film in a same direction as to the applied voltage, namely in a direction of a thickness of the film Typical production method of such conventional piezoelectric element is shown in FIGS. 22A to 22E. FIGS. 22A to 22E are cross sectional views explaining the production method of the conventional piezoelectric element.

First, as shown in FIG. 22A, under electrode 102 is formed by depositing a layer of platinum, iridium and titanium successively on first silicon substrate 101 with thermally silicon dioxide film. And then, under electrode layer 102 is patterned by a reactive ion-etching method. Next, piezoelectric thin film is deposited by a sol-gel method on under electrode layer 102. Piezoelectric thin film layer 103 is made of lead zirconate titanate (PZT) containing lead magnesium niobate. Following, forming upper electrode layer 104 by sputtering titan and iridium successively on piezoelectric thin film layer 103, and then patterning upper electrode layer 104 by reactive ion-etching.

Next, as shown in FIG. 22B, adhering an other substrate or sheet 105 through adhesive layer 106 to a side of upper electrode 104 above first substrate 101. Adhesive layer 106 is a polyester film sheet. Then, as shown in FIG. 22C, applying an ultraviolet ray (hereinafter, UV) of UV lamp to polyester film adhesive layer 106 for weakening its adhesive strength, and then peeling off first substrate 101 from adhesive layer 106. Further, as shown in FIG. 22D, adhering under electrode layer 102 through adhesive layer 107 to already prepared second substrate 108. Following, applying a UV ray to adhesive layer 106 through the other substrate or sheet 105, weakening adhesive strength of adhesive layer 106 to upper electrode layer 104, then peeling off the other substrate or sheet 105 and adhesive layer 106 from upper electrode 104, which is shown in FIG. 22E. A production method of this type conventional piezoelectric element is publicly disclosed in Unexamined Japanese Patent Application No. 2000-91656, for instance.

However, with the above conventional constitution, when upper electrode layer 104 gets an electric charge, an electric field is applied to piezoelectric thin film layer 103, changing spontaneous polarization state. Electric charge of upper electrode layer 104 is caused by a static electricity, by an electric charge generated in plasma which is used in a production process or during dry etching, or by a pyroelectric effect in piezoelectric thin film layer 103 caused by such as a sudden temperature change. If an electric field is applied in an opposite direction before the polarization process starts, it becomes difficult to fully align the direction of polarization toward a predetermined way in the polarizing process.

SUMMARY OF THE INVENTION

The invention is aimed to provide a production method of a piezoelectric element in which generation of an electric field in a piezoelectric thin film layer is avoided during a manufacturing process, securing a high piezoelectric properties or performance of the element.

The production method of the piezoelectric element of the invention includes first to fourth production processes. The first process is a depositing process for depositing an under electrode layer, piezoelectric thin film layer and an upper electrode layer successively on a substrate. The second process is etching process including dry etching. The third process is polarization process for polarizing by applying a voltage across the under electrode layer and the upper electrode layer. The fourth process is individualization process for individualizing each piezoelectric element. Because the under electrode layer and the upper electrode layer remain short-circuited in dry etching process at least, we can prevent the upper electrode layer from being electrically charged. So, we can prevent the piezoelectric thin film layer from applying electric field unexpectedly, thus, we can align polarization in one direction. In this way, the production method of the piezoelectric element securing a high piezoelectric characteristic is provided.

Figure 1:
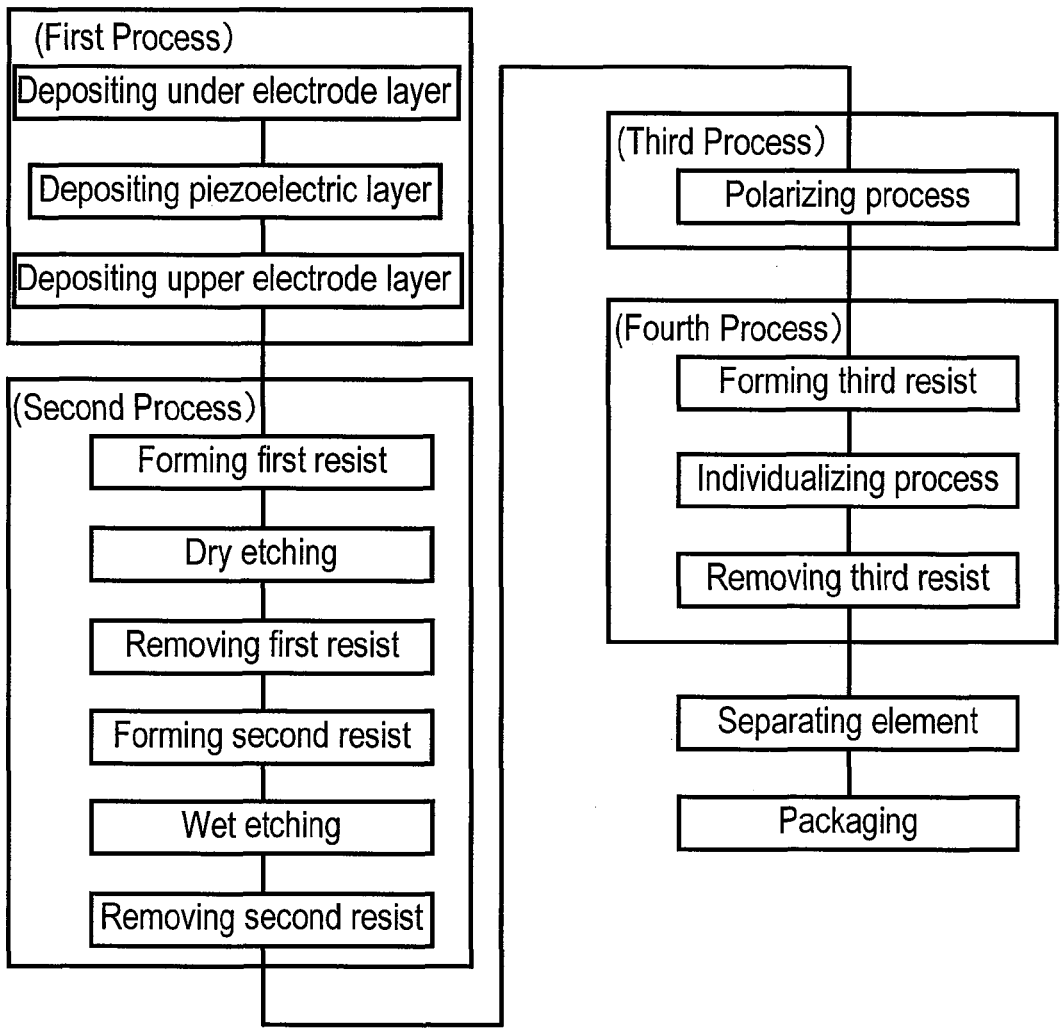
FIG. 1 is a flow chart showing a production method of a piezoelectric element in accordance with a first exemplary embodiment of the invention.

REFERENCE MARKS IN THE DRAWINGS 1 substrate
2 under electrode layer
3 piezoelectric thin film layer
4 upper electrode layer
5 first resist film
6 second resist film
7 third resist film
8 electric conductor

DETAILED DESCRIPTION OF PREFERRED EMBODIMENTS

Preferred embodiments of the invention are described hereinafter in reference to the drawings.

First Exemplary Embodiment

FIG. 1 is a flow chart showing a production method of a piezoelectric element in accordance with the first exemplary embodiment of the invention. FIGS. 2 to 15 are cross sectional views of the piezoelectric element explaining a first to a fourth process of the production method. Each manufacturing process is explained below along with the flow chart in FIG. 1. In considering a lot production of piezoelectric elements, under electrodes and upper electrodes of each element are preferably connected equipotentially. For explaining the exemplary embodiment, the drawings show cross-sectional structures of three pieces of piezoelectric element for each production process.

Figure 2:
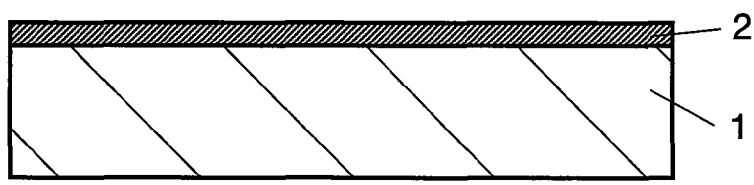
FIG. 2 is a cross sectional view explaining a first process of the production method of the piezoelectric element in accordance with the same exemplary embodiment.

In the first process shown in FIG. 2, forming under electrode layer 2 on Si substrate 1 made of silicon so as Pt is deposited to be crystallized in <111> direction. As an ordinary method of forming under electrode layer 2, platinum (Pt) is sputtered, Pt and titanium (Ti) are sputtered at the same time, or they are sputtered successively by DC current (hereinafter, DC) or high frequency current (hereinafter RF) a magnetron sputter method.

Figure 3:
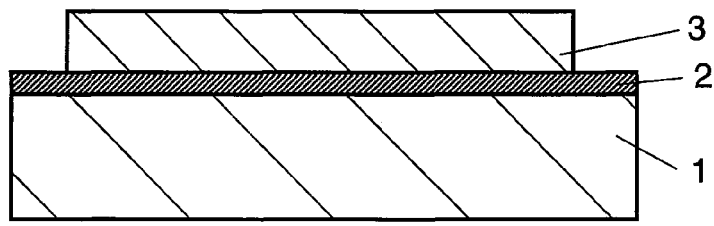
FIG. 3 is a cross sectional view explaining the first process of the production method of the piezoelectric element in accordance with the same exemplary embodiment.

Following, forming piezoelectric thin film layer 3 by sputtering lead zirconate titanate (PZT) $(Pb(Zr_{1-x}Ti_x)O_3)$ $(0<x<1)$ or the like onto under electrode layer 2 so as the material is deposited to be crystallized in <001> direction, and a dimension of piezoelectric thin film layer 3 to become smaller than that of under electrode layer 2, as shown in FIG. 3.

Figure 4:
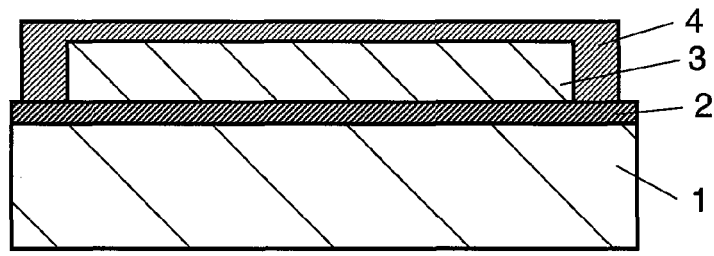
FIG. 4 is a cross sectional view explaining the first process of the production method of the piezoelectric element in accordance with the same exemplary embodiment.

Then, as shown in FIG. 4, forming upper electrode layer 4 by sputtering or by vacuum-evaporating electrode material such as gold (Au) onto piezoelectric thin film layer 3 so as layer 4 to be electrically connected to a part of under electrode layer 2, on the part piezoelectric thin film layer 3 is unformed.

By making a dimension of upper electrode layer 4 larger than that of piezoelectric thin film layer 3 and the dimension of piezoelectric thin film layer 3 smaller than under electrode layer 2, thus by short-circuiting upper electrode layer 4 and under electrode layer 2, a high production efficiency is achieved. In a case Au layer is formed directly on piezoelectric thin film layer 3 and if a sufficient adhesive strength of Au not secured, a chrome (Cr) or Ti ground layer is formed first and then the Au layer is formed. In this exemplary embodiment, Ti is used and vacuum-evaporated in a thickness of 20 angstrom (A) to 500 A, with which a sufficient adhesive strength is obtained.

As described, an area where piezoelectric thin film layer 3 is unformed is secured on under-electrode layer 2 and upper electrode layer 4 covering the area. With such arrangement, under electrode layer 2, piezoelectric thin film layer 3 and upper electrode layer 4 are deposited successively on substrate 1. Upper electrode layer 4 and under electrode layer 2 are accordingly short-circuited, keeping an equal electric potentiality between upper electrode layer 4 and under electrode layer 2. A change in polarization state in piezoelectric thin film layer 3 caused by an electrical charging of upper electrode layer 4 is so prevented with this structure.

When it is difficult to short-circuit upper electrode layer 4 and under electrode layer 2 by just patterning upper electrode layer 4, a conductive adhesive can be used for connecting upper electrode layer 4 and under electrode layer 2, besides patterning of electrode layer 4. In this way, upper electrode layer 4 and under electrode layer 2 are short-circuited with a conductive adhesive. The conductive adhesive is removed immediately by a mechanical process or using a solvent before the polarizing process starts, so that a production method of a piezoelectric material which aligns polarization homogeneously in a predetermined direction is realized. As an alternative method, a wire bonding or a conductive tape is utilized for short-circuiting upper electrode layer 4 and under electrode layer 2, exhibiting an equivalent effect as a conductive adhesive. An optimal method for short-circuiting upper electrode layer 4 and under electrode layer 2 is conveniently selected by viewing an application, a structure and a cost of the piezoelectric element.

In the above structure, under electrode layer 2 and upper electrode layer 4 are short-circuited after piezoelectric thin film layer 3 is formed but before polarization process is started, therewith a polarization state or direction of piezoelectric thin film layer 3 is stably maintained, making possible to align polarization in a predetermined direction in the polarization process. When piezoelectric thin film layer 3 is exposed to an electric field during production process including post process, thin film layer 3 is likely to be partially destructed by an electric discharge due to pyroelectric effect. However, the electric discharge destruction due to the pyroelectric effect can be prevented by short-circuiting electrode layer 2 and upper electrode layer 4 in advance. An abrupt change in temperature can also cause a partial destruction of the piezoelectric thin film layer 3 by the electric discharge caused by the pyroelectricity, but such destruction can also be prevented by short-circuiting electrode layer 2 and upper electrode layer 4 in advance.

Figure 5:
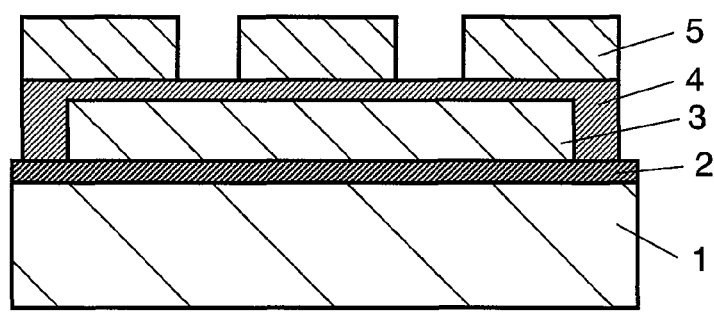
FIG. 5 is a cross sectional view explaining a second process of the production method of the piezoelectric element in accordance with the same exemplary embodiment.
Figure 6:
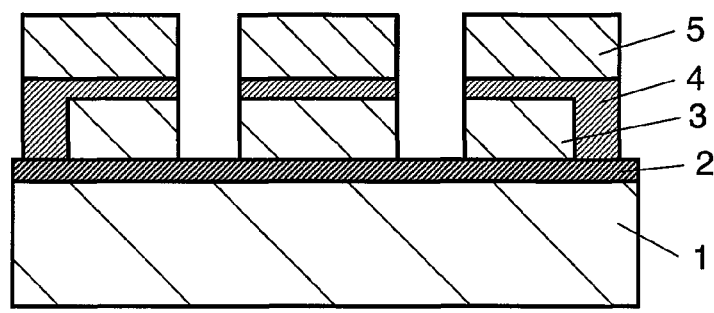
FIG. 6 is a cross sectional view explaining the second process of the production method of the piezoelectric element in accordance with the same exemplary embodiment.
Figure 7:
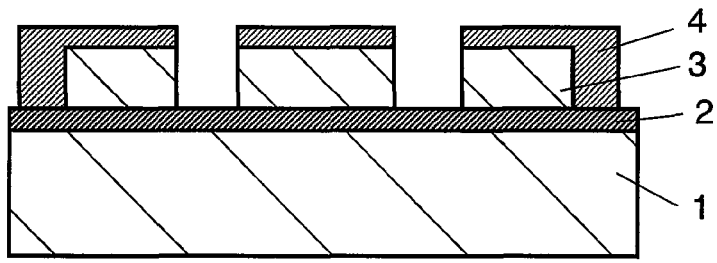
FIG. 7 is a cross sectional view explaining the second process of the production method of the piezoelectric element in accordance with the same exemplary embodiment.

Next, as the second process, forming first resist film 5, as illustrated in FIG. 5. Succeeding, as in FIG. 6, dry etching upper electrode layer 4 and piezoelectric thin film layer 3 down to a surface of under electrode layer 2. Following, removing first resist film 5, as shown in FIG. 7. Dry etching is a highly precise fine patterning method, so is suitable for producing a miniature high precision piezoelectric element.

As a dry etching, parallel plate type reactive ion etching is popular. In this method, a work piece is placed in a vacuum etching chamber, and etching gas typically composed of 20 standard cubic centimeters (sccm) of carbon tetrafloride ($CF_4$) and 40 sccm of argon (Ar) is introduced into the chamber, a vacuum of 20 to 100 mTorr is preferable.

Then, putting a work piece on a holder placed in parallel with an upper electrode of the dry etching equipment (not illustrated) and applying a 700 W high frequency electric power, successively the etching gas becomes plasma. As an etch-seed reaches a film surface of the work piece in the plasma, a chemical reaction occurs on the work piece then the chemical substance is broken off from the surface of the work piece, completing etching. At this time, since under electrode layer 2 and upper electrode layer 4 are short-circuited, no electric field can apply to upper electrode layer 4 or electrode layer 2, therefore polarization state or direction of piezoelectric thin film layer 3 is stably maintained.

Figure 8:
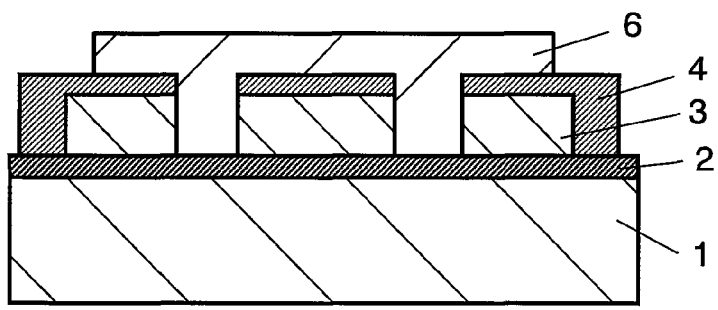
FIG. 8 is a cross sectional view explaining the second process of the production method of the piezoelectric element in accordance with the same exemplary embodiment.
Figure 9:
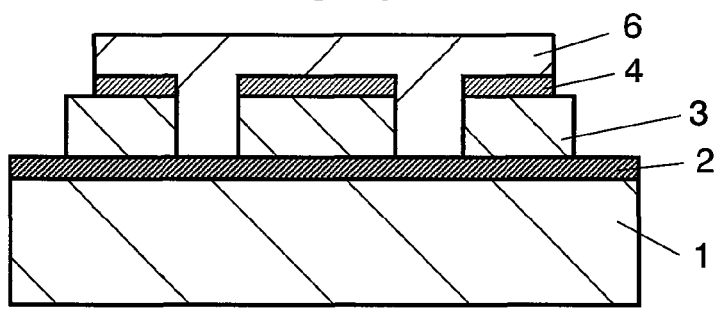
FIG. 9 is a cross sectional view explaining the second process of the production method of the piezoelectric element in accordance with the same exemplary embodiment.
Figure 10:
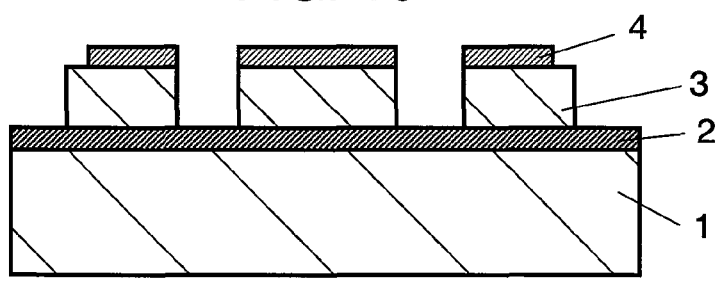
FIG. 10 is a cross sectional view explaining the second process of the production method of the piezoelectric element in accordance with the same exemplary embodiment.

Then, forming second resist film 6, as in FIG. 8. Following, as in FIG. 9, wet etching a part of upper electrode layer 4 by using acid or alkaline solution, the part short-circuiting upper electrode and lower electrode. Successively, removing second resist film 2, as shown in FIG. 10.

As an etching method, dry etching and wet etching are common. Dry etching is a technology suitable for etching a micro processed work piece in a highly precision manner, but it may cause damage to a piezoelectric thin film having ferroelectricity. On the other hand, wet etching causes little process damage but etching progresses isotropically possibly causing a side etching, so it is not suitable for processing a micro processed work piece. By combining both of the characteristics, a high precision high performance piezoelectric element production method can be achieved. A short-circuit portion between upper electrode layer 4 and under electrode layer 2 can be formed arbitrarily at any place within a predetermined area in view of a shape of the piezoelectric element and its production process.

Figure 11:
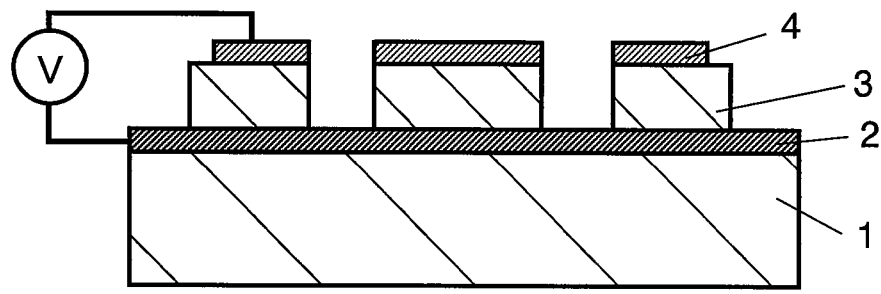
FIG. 11 is a cross sectional view explaining a third process of the production method of the piezoelectric element in accordance with the same exemplary embodiment.

Next, in the third process, applying a DC current across under electrode layer 2 and upper electrode layer 4 for polarizing the piezoelectric film, as shown in FIG. 11. Polarization is preferably made by heating the piezoelectric element up to a neighborhood of Currie Temperature of the piezoelectric material. While the temperature is going up or down, the change of polarization state due to pyroelectric effect is avoided by short-circuiting under electrode layer 2 and upper electrode layer 4.

Figure 12:
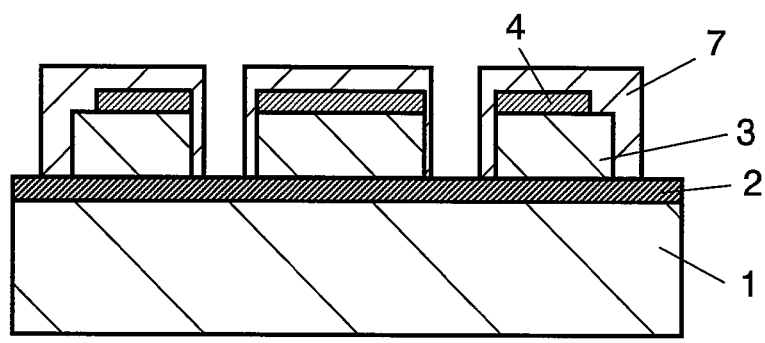
FIG. 12 is a cross sectional view explaining a fourth process of the production method of the piezoelectric element in accordance with the same exemplary embodiment.

Following, as the fourth process, forming third resist film 7 for covering upper electrode layer 4, piezoelectric thin film layer 3 and a part of under electrode layer 2 so that individual piezoelectric element can take its own shape for individualization, which is shown in FIG. 12. In this process, third resist film 7 entirely covers upper electrode layer 4 and piezoelectric thin film layer 3, reducing a possibility of damage due to electric discharge to be caused in a post process. By giving electric conductivity to third resist film 7, a possibility of damage due to electric discharge is further reduced.

Figure 13:
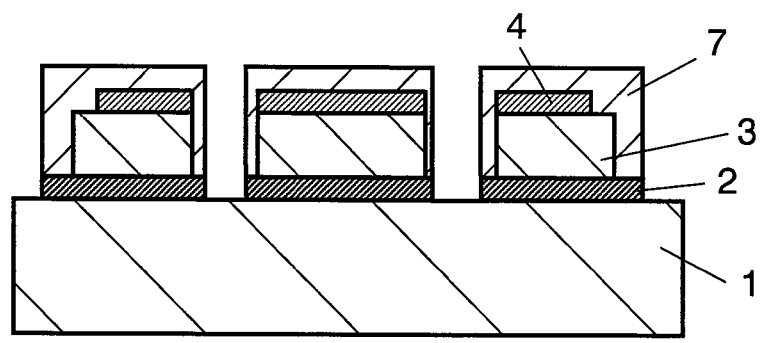
FIG. 13 is a cross sectional view explaining the fourth process of the production method of the piezoelectric element in accordance with the same exemplary embodiment.
Figure 14:
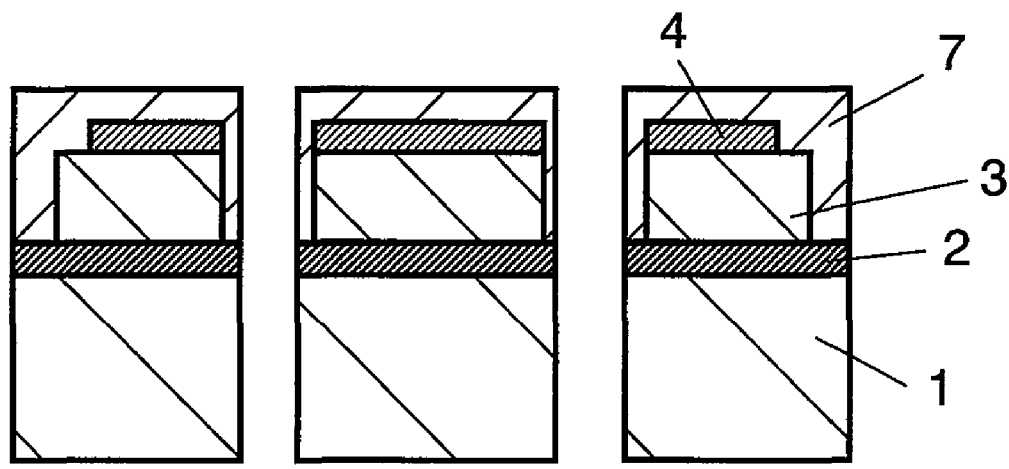
FIG. 14 is a cross sectional view for explaining the fourth process of the production method of the piezoelectric element in accordance with the same exemplary embodiment.

Then, as shown in FIG. 13, dry etching an exposed portion of under electrode layer 2. Following, as shown in FIG. 14, dry etching silicone substrate 1 to individualize each piezoelectric element. At starting dry etching substrate 1, gas is preferably changed from the one used for etching under electrode layer 2 to a different gas. If etching continues without the gas change, under electrode layer 2 is possibly side-etched.

For etching under electrode layer 2, $CF_4$ gas or Ar gas is typically used. While, for etching silicone substrate 1, sulfer hexafluoride ($SF_6$) or cycropropane octafluoride ($C_4F_8$) gas is typically used, with which only silicone substrate 1 is etched vertically downward in a highly precision manner, and a skirt portion of under electrode 2 that is formed under piezoelectric thin film layer 3 by etching under electrode layer 2 remains undamaged.

In above fourth process, individual pieces are prepared by etching. However, individual pieces can as well be prepared by dicing. A suitable method can be conveniently selected considering a shape of the element and a production efficiency of the element.

Figure 15:
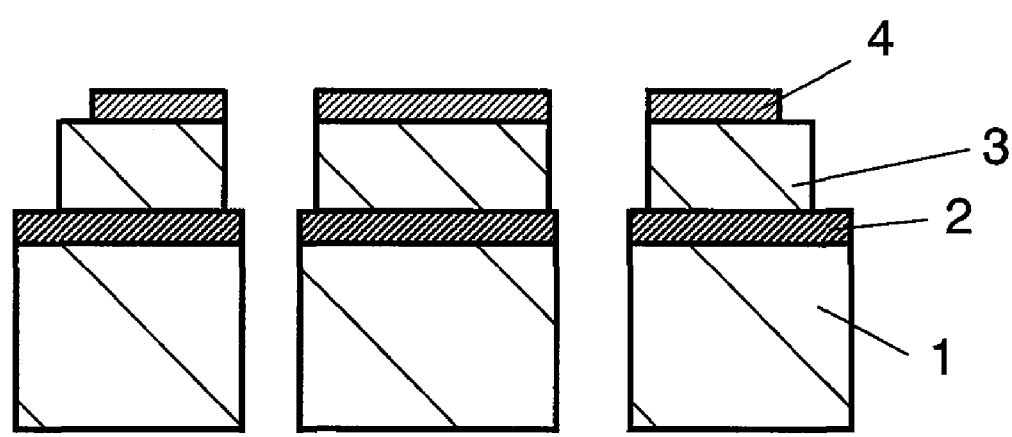
FIG. 15 is a cross sectional view explaining the fourth process of the production method of the piezoelectric element in accordance with the same exemplary embodiment.

Following, as in FIG. 15, removing third resist film 7 by using resist removing solution or solvent, applying a UV ray or using ozone. With this arrangement, third resist film 7 is removed while generation of electric field in piezoelectric thin film layer 3 is prevented to happen during the whole process. Thus, piezoelectric element having a high performance is fabricated in a highly precision manner. Finally, the individual piezoelectric element is placed in a hermetic package (not illustrated) of ceramic or the like and is fixed thereto typically by bonding. By connecting under electrode layer 2 and upper electrode layer 4 by wire bonding or other means, production of a piezoelectric device such as a piezoelectric filter, a piezoelectric actuator and a variety of sensor elements becomes possible.

In order for short-circuiting upper electrode layer 4 and under electrode layer 2 after forming thin film layer 3, a conductive adhesive, a conductive tape made of carbon or copper foil or wire bonding is utilized, with which it is easy to remove the short-circuit portion in post process. Moreover, by short-circuiting upper electrode layers 4 and under electrode layers 2 of multiple piezoelectric elements in parallel, it is possible to prevent change of polarization state.

As described, the production method of the piezoelectric element according to the first embodiment of the invention short-circuits under electrode layer 2 and upper electrode layer 4 before starting polarizing process, so that the stable polarization state or direction is maintained with the element, thus a production method for producing a piezoelectric element secured to have a high performance is provided.

Second Exemplary Embodiment

Figure 16:
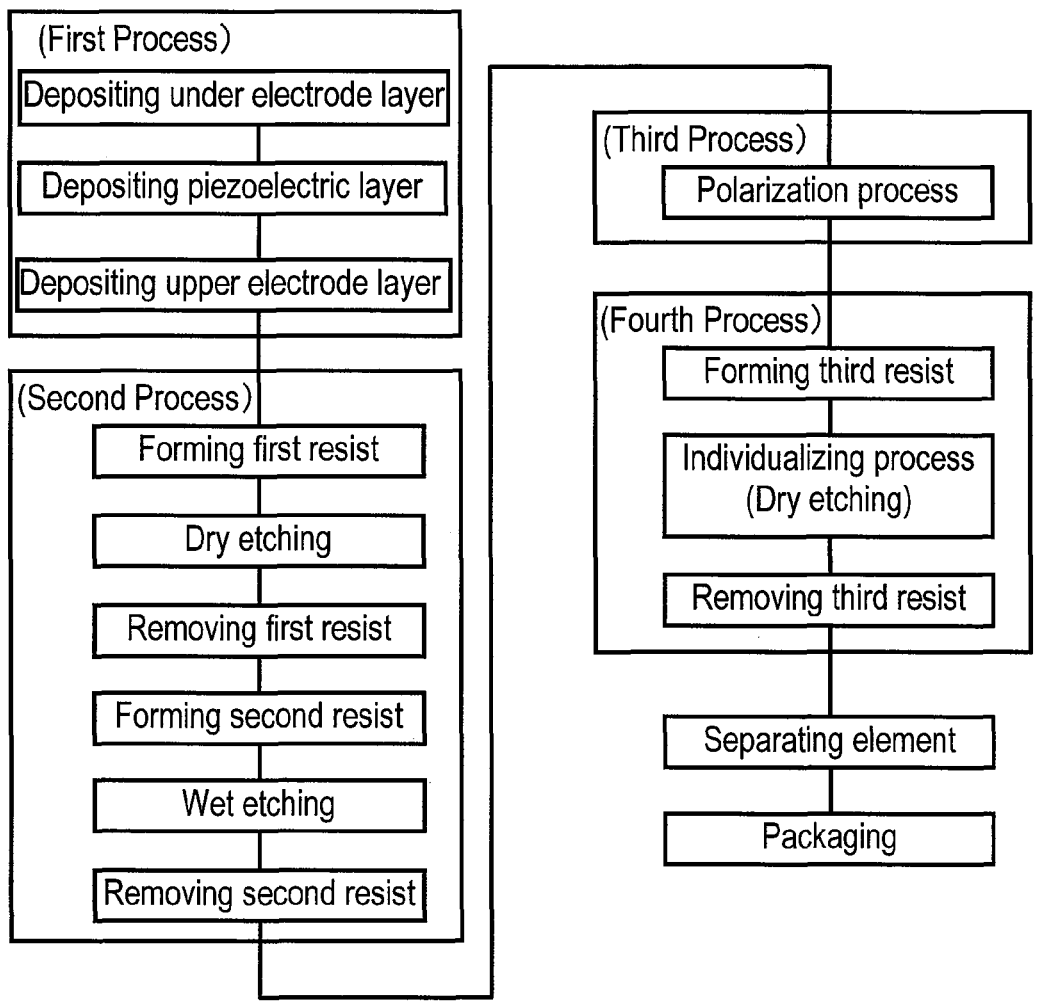
FIG. 16 is a flow chart showing a production method of a piezoelectric element in accordance with a second exemplary embodiment of the invention.

FIG. 16 is a flow chart showing a production method of a piezoelectric element in accordance with the second exemplary embodiment of the invention. FIGS. 17 to 21 are cross sectional views illustrating the production method of the piezoelectric element in the second exemplary embodiment and which are explained with reference to the flow chart in FIG. 16. The production method according to the second embodiment is greatly different from the first exemplary embodiment, and under electrode layer 2 and upper electrode layer 4 once opened just before the polarization process are short-circuited again after polarization process. With this arrangement, polarization state or direction is stably maintained and occurrence of static destruction or pyroelectric destruction is avoided. As a result, in the production method, polarization state or direction after the polarization is more securely maintained even up to the final stage of completing the piezoelectric element.

In this production method, lot production is also preferable from a productivity standpoint, so under electrode layers 2 and upper electrode layers 4 of multiple piezoelectric elements in a wafer are fundamentally short-circuited in a predetermined area. The element is produced by an identical process of the first to third process of the first exemplary. The first to third processes of this exemplary embodiment are identical to that of FIGS. 2 to 11 of the first embodiment, so explanation of them is omitted.

Figure 17:
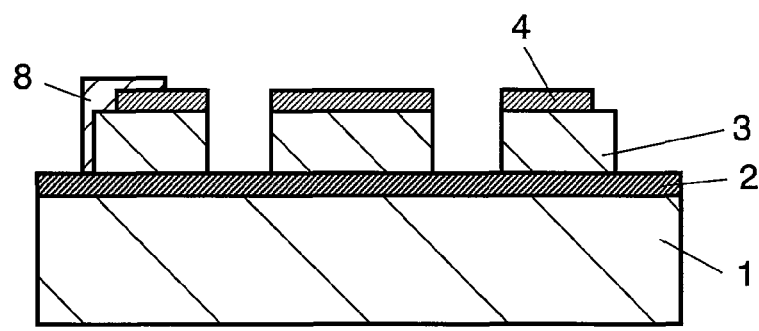
FIG. 17 is a cross sectional view explaining a fourth process of the production method of the piezoelectric element in accordance with the same exemplary embodiment.

In the fourth process, as FIG. 17 shows, electrically connecting under electrode layer 2 on silicon substrate 1 with upper electrode layer 4. More specifically, short-circuiting upper electrode layer 4 and under electrode layer 2 by forming electric conductor 8 with a conductive adhesive, a conductive tape of carbon or copper foil, or with wire bonding. By using such material for the electric conductor, breaking the short-circuited portion in a later process becomes speedy and easy. Further, by connecting upper electrode layers 4 and under electrode layers 2 of multiple piezoelectric elements formed on substrate 1, an easy and blanket short-circuiting of multiple piezoelectric elements is realized, achieving a simplified production process.

Figure 18:
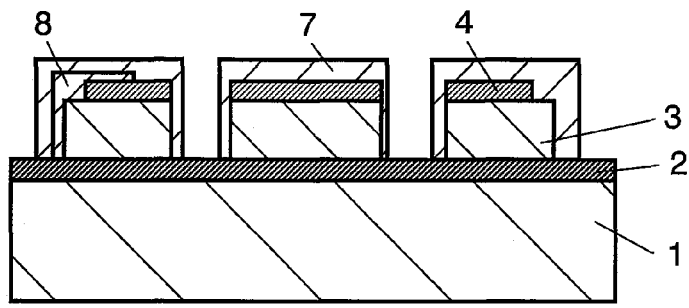
FIG. 18 is a cross sectional view explaining the fourth process of the production method of the piezoelectric element in accordance with the same exemplary embodiment.
Figure 19:
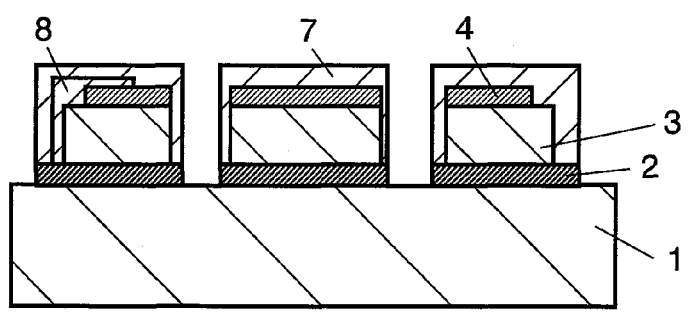
FIG. 19 is a cross sectional view explaining the fourth process of the production method of the piezoelectric element in accordance with the same exemplary embodiment.
Figure 20:
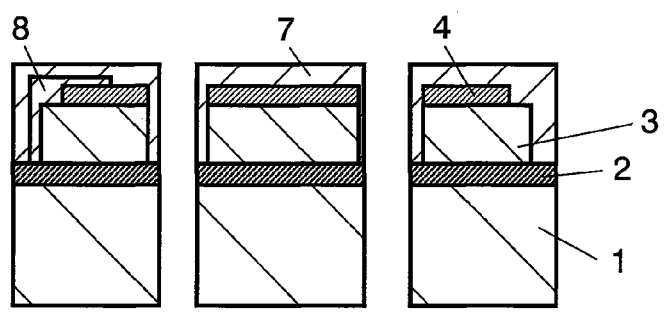
FIG. 20 is a cross sectional view explaining the fourth process of the production method of the piezoelectric element in accordance with the same exemplary embodiment.

Following, forming third resist film 7 covering a surface of the element but leaving a portion of under electrode layer 2, which is shown in FIG. 18. Then, as is shown in FIG. 19, dry etching the portion of under electrode layer 2 down to a surface of substrate 1, and then dry etching silicone substrate 1 as is shown in FIG. 20. The etching is performed with an identical method employed in exemplary embodiment 1.

Figure 21:
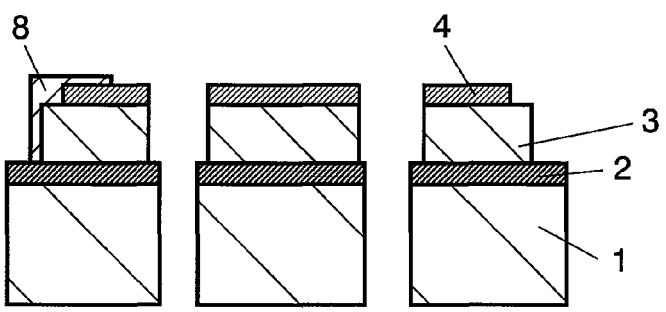
FIG. 21 is a cross sectional view explaining the fourth process of the production method of the piezoelectric element in accordance with the same exemplary embodiment.
Figure 22A:
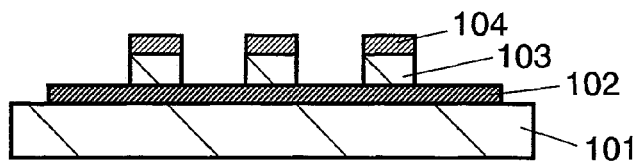
FIG. 22A is a cross sectional view showing a production method of a conventional piezoelectric element.
Figure 22B:
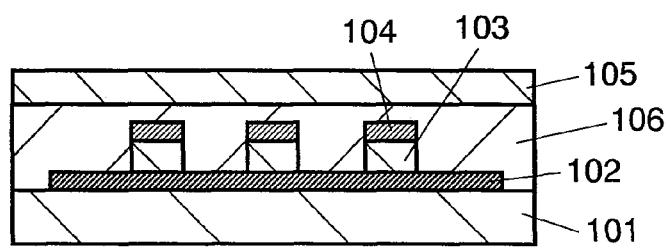
FIG. 22B is a cross sectional view showing the production method of the conventional piezoelectric element.
Figure 22C:
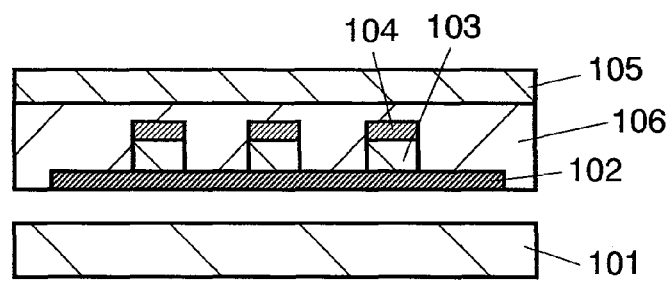
FIG. 22C is a cross sectional view showing the production method of the conventional piezoelectric element.
Figure 22D:
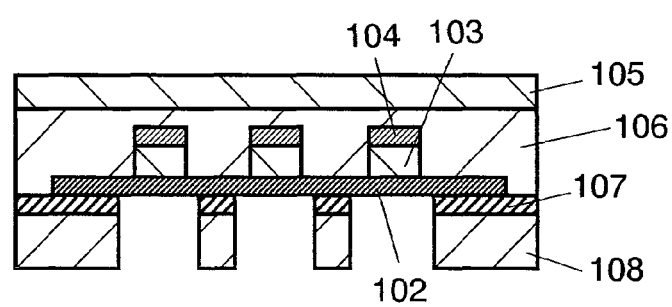
FIG. 22D is a cross sectional view showing the production method of the conventional piezoelectric element.
Figure 22E:
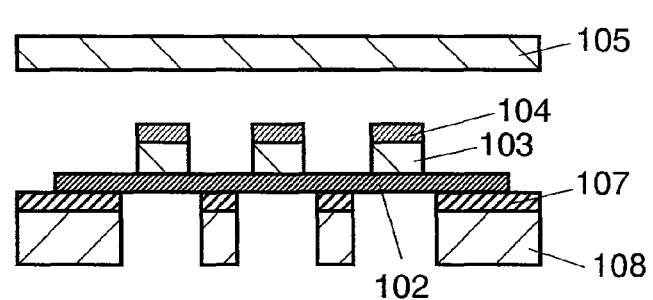
FIG. 22E is a cross sectional view showing the production method of the conventional piezoelectric element.

Next, as shown in FIG. 21, removing third resist film 7 using a resist removal solution or solvent, a UV ray or ozone. Following, fixing individual piezoelectric element to a hermetic package (not illustrated) made of ceramic or the like, next wire bonding under electrode layer 2 and upper electrode layer 4 for wiring, and then breaking the short-circuited portion between upper electrode layer 4 and under electrode layer 2, finishing each individual piezoelectric element.

INDUSTRIAL APPLICABILITY

As mentioned above, the production method of the piezoelectric element of the invention avoids an electric field to be applied to a piezoelectric thin film layer due to an electric charging of an upper electrode layer, preventing predetermined direction of polarization from changing and also preventing piezoelectric thin film from being damaged during the production process. The method is useful for producing a high performance piezoelectric element employing the piezoelectric thin film, to be used for a sensor, an actuator or the like.

The invention claimed is:

1. A production method of a piezoelectric element comprising:
   a first process for depositing an under electrode layer, a piezoelectric thin film layer and an upper electrode layer successively on a substrate such that the under electrode layer and the upper electrode layer form a short-circuit;
   a second process, after the first process, for etching including dry etching, the second process commenced while the under electrode layer and the upper electrode layer are short-circuited;
   a third process, after the second process, for polarizing by applying a voltage across the under electrode layer and the upper electrode layer; and
   a fourth process, after the third process, for individualizing the element into independent units.

2. The production method of the piezoelectric element according to claim 1, wherein the first process includes a process for short-circuiting the under electrode layer and the upper electrode layer by depositing the upper electrode layer.

3. The production method of the piezoelectric element according to claim 2, wherein the first process includes a process for short-circuiting the upper electrode layer and under electrode layer by making a dimension of the piezoelectric thin film layer smaller than that of the under electrode layer and a dimension of the upper electrode layer larger than that of the piezoelectric thin film layer.

4. The production method of the piezoelectric element according to claim 1, wherein the first process includes a process for short-circuiting the under electrode layer and the upper electrode layer with a conductive adhesive.

5. The production method of the piezoelectric element according to claim 1, wherein the first process includes a process for short-circuiting the under electrode layer and the upper electrode layer with a wire bonding.

6. The production method of the piezoelectric element according to claim 1, wherein the first process includes a process for short-circuiting the under electrode layer and the upper electrode layer with a conductive tape.

7. The production method of the piezoelectric element according to claim 1, wherein the second process includes dry etching for shaping the piezoelectric element and then wet etching for breaking the short-circuit portion between the under electrode layer and the upper electrode layer.

8. The production method of the piezoelectric element according to claim 1, wherein the third process includes breaking short-circuit portion between the under electrode layer and the upper electrode layer before the polarizing process starts.

9. The production method of the piezoelectric element according to claim 1, wherein the third process includes a process for short-circuiting again the upper electrode layer and the under electrode layer after the polarizing process is finished, and the fourth process includes a process for breaking the short-circuit portion between the under electrode layer and the upper electrode layer after dry etching process.

* * * * *